United States Patent
Honda et al.

(10) Patent No.: US 8,790,489 B2
(45) Date of Patent: Jul. 29, 2014

(54) SUBSTRATE PROCESSING APPARATUS AND SUBSTRATE PROCESSING METHOD

(75) Inventors: Masanobu Honda, Nirasaki (JP); Kazuhiro Kubota, Nirasaki (JP); Yoshinobu Ooya, Nirasaki (JP); Masaru Nishino, Nirasaki (JP)

(73) Assignee: Tokyo Electron Limited (JP)

( * ) Notice: Subject to any disclaimer, the term of this patent is extended or adjusted under 35 U.S.C. 154(b) by 263 days.

(21) Appl. No.: 13/175,096

(22) Filed: Jul. 1, 2011

(65) Prior Publication Data

US 2012/0000886 A1 Jan. 5, 2012

Related U.S. Application Data

(60) Provisional application No. 61/365,597, filed on Jul. 19, 2010.

(30) Foreign Application Priority Data

Jul. 5, 2010 (JP) .................................. 2010-153096

(51) Int. Cl.
| | | |
|---|---|---|
| C23C 16/455 | (2006.01) | |
| C23F 1/00 | (2006.01) | |
| H01L 21/306 | (2006.01) | |
| H01L 21/311 | (2006.01) | |
| H01J 37/32 | (2006.01) | |
| H01L 21/67 | (2006.01) | |
| H01J 37/18 | (2006.01) | |
| C23C 16/06 | (2006.01) | |
| C23C 16/22 | (2006.01) | |

(52) U.S. Cl.
CPC ...... *H01L 21/6719* (2013.01); *H01L 21/31138* (2013.01); *H01J 37/32091* (2013.01); *H01L 21/31116* (2013.01); *H01L 21/31122* (2013.01); *H01L 21/31144* (2013.01); *H01J 37/32633* (2013.01); *H01J 37/32834* (2013.01); *H01J 37/18* (2013.01)
USPC ..................................... 156/345.29; 118/715

(58) Field of Classification Search
USPC ....................... 118/715; 156/345.29
See application file for complete search history.

(56) References Cited

U.S. PATENT DOCUMENTS 5,210,466 A * 5/1993 Collins et al. ............ 315/111.21
5,605,637 A * 2/1997 Shan et al. ....................... 216/71

(Continued)

FOREIGN PATENT DOCUMENTS

| JP | 2003249487 | 9/2003 |
|---|---|---|
| JP | 2004006574 | 1/2004 |

(Continued)

OTHER PUBLICATIONS

Ohmusa, New Edition of Vacuum Handbook, p. 41 and 43, Ulvac Corporation Compilation.

*Primary Examiner* — Rudy Zervigon
(74) *Attorney, Agent, or Firm* — Cantor Colburn LLP

(57) ABSTRACT

The substrate processing apparatus includes a process chamber which accommodates a wafer and performs a plasma etching process on the wafer, an exhaust chamber which communicates with the process chamber, an exhaust plate which divides the process chamber from the exhaust chamber and prevents plasma inside the process chamber from leaking into the exhaust chamber, and an upper electrode plate arranged inside the exhaust chamber, wherein the exhaust plate includes a plurality of through holes, and the upper electrode plate includes a plurality of through holes, is capable of contacting the exhaust plate in parallel, and is capable of being spaced apart from the exhaust plate.

7 Claims, 12 Drawing Sheets

(56) References Cited

U.S. PATENT DOCUMENTS

| | | | |
|---|---|---|---|
| 5,891,350 A * | 4/1999 | Shan et al. | 216/71 |
| 5,919,332 A * | 7/1999 | Koshiishi et al. | 156/345.47 |
| 6,156,151 A * | 12/2000 | Komino et al. | 156/345.29 |
| 6,178,919 B1 * | 1/2001 | Li et al. | 118/723 E |
| 6,206,976 B1 * | 3/2001 | Crevasse et al. | 118/720 |
| 6,261,408 B1 * | 7/2001 | Schneider et al. | 156/345.26 |
| 6,726,801 B2 * | 4/2004 | Ahn | 156/345.29 |
| 6,767,429 B2 * | 7/2004 | Amano | 156/345.29 |
| 6,963,043 B2 * | 11/2005 | Fink | 219/121.43 |
| 7,311,784 B2 * | 12/2007 | Fink | 118/728 |
| 7,416,677 B2 * | 8/2008 | Takahashi | 216/71 |
| 7,648,610 B2 * | 1/2010 | Komiya et al. | 156/345.29 |
| 7,749,326 B2 * | 7/2010 | Kim et al. | 118/715 |
| 8,012,305 B2 * | 9/2011 | Takahashi | 156/345.28 |
| 8,075,728 B2 * | 12/2011 | Balakrishna et al. | 156/345.26 |
| 8,152,925 B2 * | 4/2012 | Iizuka | 118/715 |
| 8,236,105 B2 * | 8/2012 | Bera et al. | 118/715 |
| 8,262,798 B2 * | 9/2012 | Yamada et al. | 118/724 |
| 8,273,211 B2 * | 9/2012 | Hur et al. | 156/345.48 |
| 8,539,908 B2 * | 9/2013 | Takagi | 118/696 |
| 2002/0038791 A1 * | 4/2002 | Okumura et al. | 216/71 |
| 2002/0104482 A1 * | 8/2002 | Kazumi et al. | 118/723 R |
| 2004/0082251 A1 * | 4/2004 | Bach et al. | 445/60 |
| 2004/0129218 A1 * | 7/2004 | Takahashi et al. | 118/715 |
| 2005/0103267 A1 * | 5/2005 | Hur et al. | 118/715 |
| 2005/0167052 A1 * | 8/2005 | Ishihara et al. | 156/345.47 |
| 2005/0205208 A1 * | 9/2005 | Sagae et al. | 156/345.28 |
| 2005/0208217 A1 * | 9/2005 | Shinriki et al. | 427/248.1 |
| 2005/0224180 A1 * | 10/2005 | Bera et al. | 156/345.33 |
| 2006/0011299 A1 * | 1/2006 | Condrashoff et al. | 156/345.47 |
| 2006/0090853 A1 * | 5/2006 | Kido et al. | 156/345.33 |
| 2007/0266945 A1 * | 11/2007 | Shuto et al. | 118/723 E |
| 2008/0035605 A1 * | 2/2008 | Takahashi | 216/58 |
| 2008/0295964 A1 * | 12/2008 | Takahashi | 156/345.28 |
| 2009/0025877 A1 * | 1/2009 | Hur et al. | 156/345.43 |
| 2012/0000886 A1 * | 1/2012 | Honda et al. | 216/24 |

FOREIGN PATENT DOCUMENTS

| | | |
|---|---|---|
| JP | 2004511096 | 4/2004 |
| JP | 2008-527634 | 7/2008 |
| WO | 0229848 | 4/2002 |

* cited by examiner

SUBSTRATE PROCESSING APPARATUS AND SUBSTRATE PROCESSING METHOD

CROSS-REFERENCE TO RELATED PATENT APPLICATIONS

This application claims the benefits of Japanese Patent Application No. 2010-153096, filed on Jul. 5, 2010 in the Japan Patent Office, and U.S. Patent Application No. 61/365,597, filed on Jul. 19, 2010 in the U.S. Patent and Trademark Office, the disclosures of which are incorporated herein in its entirety by reference.

BACKGROUND OF THE INVENTION

1. Field of the Invention

The present invention relates to a substrate processing apparatus and a substrate processing method.

2. Description of the Related Art

Recently, an etching target film of a substrate, such as a wafer or the like for a semiconductor device, is being multi-layered. Generally, an etching target film is formed of a photoresist film, a reflection preventing film, a hard mask, an oxide film, or the like, and it is required to etch each of etching target films by using one substrate processing apparatus from a point of view for production efficiency improvement despite different etching conditions of each film, i.e., to etch each etching target film by using one substrate processing apparatus while changing an etching condition.

In order to change an etching condition in one substrate processing apparatus, not only is a type of a process gas supplied into a process chamber accommodating a substrate or a value of high frequency power applied to an inside of the process chamber required to be changed, but also a pressure inside the process chamber is required to be adjusted. Conventionally, the pressure inside the process chamber is adjusted by an Adaptive Pressure Controller (hereinafter, referred to as an APC) provided at an exhaust pipe that evacuates a gas inside the process chamber, but since the APC adjusts the pressure by using a slide valve having a large diameter, it is difficult to precisely adjust the pressure in an almost opened state or an almost closed state, i.e., at a relatively low pressure or a relatively high pressure.

Thus, recently, precise adjustment of the pressure at a relatively low pressure or a relatively high pressure by adjusting a degree of easiness of a gas flow in the process chamber, specifically, the degree of easiness (exhaust conductance) of exhaust from the process chamber, is being studied. For example, adjusting a pressure on a wafer or confining plasma by arranging a plurality of rings each having a diameter larger than a wafer to surround the wafer in the process chamber and adjusting an interval between the rings has been suggested (for example, refer to Patent Reference 1).

However, in a technology of Patent Reference 1 described above, since the rings are arranged in the process chamber, reaction products may be attached to the rings, and thus particles may be appeared as the reaction products are peeled off when the rings move. Also, although the interval between the rings is adjustable, the rings cannot be removed, and thus exhaust resistance resulting from the arrangement of the rings cannot be removed. Accordingly, an adjustment range of the exhaust conductance is still limited. Further, since the rings are arranged inside the process chamber, distribution of plasma may be scattered.

3. Prior Art Reference (Patent Reference 1) Japanese Unexamined Patent Application Publication (Translation of PCT application) No. 2008-527634

SUMMARY OF THE INVENTION

To solve the above and/or other problems, the present invention provides a substrate processing apparatus and a substrate processing method, where particles may be prevented from being generated in a process chamber, distribution of plasma in the process chamber may be prevented from being scattered, and an adjustment range of exhaust conductance may be enlarged.

According to an aspect of the present invention, there is provided a substrate processing apparatus which includes a process chamber which accommodates a substrate to perform a plasma process on the substrate, an exhaust chamber which communicates with the process chamber, and an exhaust plate which divides the process chamber from the exhaust chamber and prevents plasma in the process chamber from leaking into the exhaust chamber, wherein the exhaust plate includes a plurality of first ventilation holes penetrating through the exhaust plate, the substrate processing apparatus including: an exhaust adjustment plate arranged inside the exhaust chamber, wherein the exhaust adjustment plate includes a plurality of second ventilation holes penetrating through the exhaust adjustment plate, is capable of contacting the exhaust plate in parallel, and is capable of being spaced apart from the exhaust plate.

The exhaust adjustment plate may be divided into at least two sections, and when the exhaust adjustment plate is divided, the at least two sections may be arranged in different locations, respectively, in a flow direction of exhaust.

The exhaust adjustment plate may have an annular shape when viewed from a plane, and may be divided into at least an inner circumference section and an outer circumference section.

The exhaust adjustment plate may be spaced apart from the exhaust plate by 4 mm or more.

The first ventilation holes may have a cylindrical shape, and when L denotes a length of the first ventilation holes and D denotes a diameter of the first ventilation holes, a relationship between L and D is $L/D < 1.33$.

A cross-sectional shape of the first ventilation holes may be a circular, rectangular, or slit shape.

A cross-sectional shape of the second ventilation holes may be a circular, rectangular, or slit shape.

The exhaust plate may be arranged parallel to the substrate accommodated inside the process chamber, and may be arranged at a location lower than a top surface of the substrate.

According to another aspect of the present invention, there is provided a substrate processing method performed by a substrate processing apparatus including a process chamber which accommodates a substrate and performs a plasma process on the substrate, an exhaust chamber which communicates with the process chamber, an exhaust plate which divides the process chamber from the exhaust chamber and prevents plasma inside the process chamber from leaking into the exhaust chamber, and an exhaust adjustment plate which is arranged inside the exhaust chamber, wherein the exhaust plate includes a plurality of first ventilation holes penetrating through the exhaust plate, and the exhaust adjustment plate includes a plurality of second ventilation holes penetrating through the exhaust adjustment plate, is capable of contacting the exhaust plate in parallel, and is capable of being spaced apart from the exhaust plate, the substrate processing method including: contacting the exhaust adjustment plate to the exhaust plate in a medium exhaust conductance mode, wherein resistance of exhaust from an inside of the process chamber is medium; and spacing the exhaust adjustment plate from the exhaust plate in a low exhaust conductance mode, wherein resistance of exhaust from the inside of the process chamber is high.

The exhaust adjustment plate may be spaced apart from the exhaust plate by 4 mm or more in the low exhaust conductance mode.

The exhaust adjustment plate may be divided into at least two sections, and the at least two sections may be arranged in different locations in a flow direction of exhaust, respectively, in a high exhaust conductance mode, wherein resistance of exhaust from the inside of the process chamber may be low.

A reflection preventing film and/or a hard mask may be etched in the medium exhaust conductance mode, an amorphous carbon film and/or an oxide film may be etched in the high exhaust conductance mode, and a waferless dry cleaning process may be performed in the low exhaust conductance mode.

BRIEF DESCRIPTION OF THE DRAWINGS

The above and other features and advantages of the present invention will become more apparent by describing in detail exemplary embodiments thereof with reference to the attached drawings in which:

FIG. 2A shows a medium exhaust conductance mode and FIG. 2B shows a low exhaust conductance mode;

FIG. 4A is a plan view of the exhaust adjustment plate, FIG. 4B is a plan view of a first modified example of the exhaust adjustment plate, FIG. 4C is a lateral cross-sectional view showing a divided state of the first modified example, FIG. 4D is a plan view of a second modified example of the exhaust adjustment plate, and FIG. 4E is a lateral cross-sectional view showing a divided state of the second modified example;

FIG. 5A shows a high exhaust conductance mode, FIG. 5B shows a medium exhaust conductance mode, and FIG. 5C shows a low exhaust conductance mode;

FIG. 8A shows a high exhaust conductance mode, FIG. 8B shows a medium exhaust conductance mode, and FIG. 8C shows a low exhaust conductance mode.

DETAILED DESCRIPTION OF THE INVENTION

Hereinafter, the present invention will be described in detail by explaining exemplary embodiments of the invention with reference to the attached drawings. First, a substrate processing apparatus according to a first embodiment of the present invention will be described.

Figure 1:
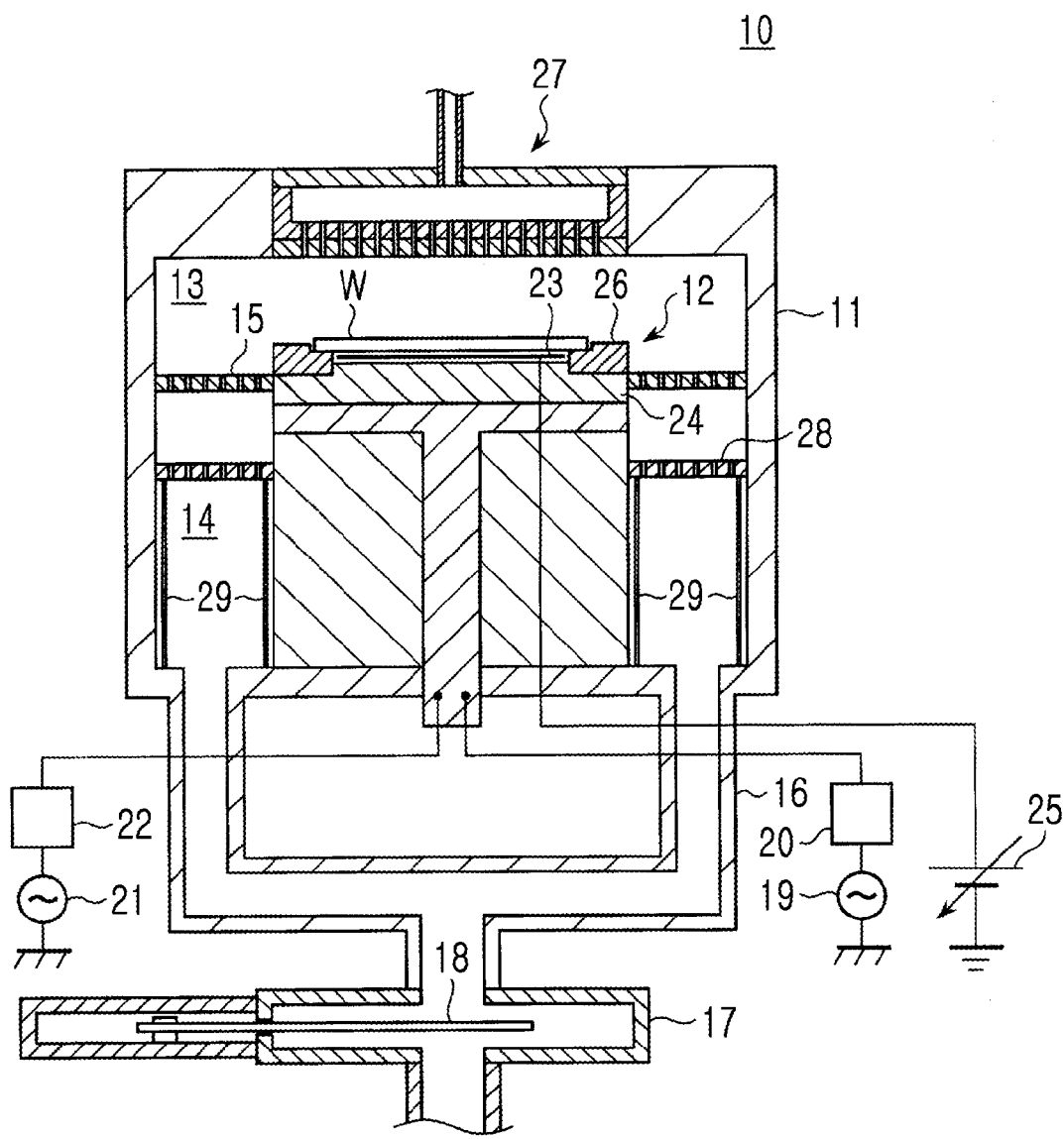
FIG. 1 is a view schematically showing a structure of a substrate processing apparatus, according to a first embodiment of the present invention.

FIG. 1 is a view schematically showing a structure of a substrate processing apparatus according to the present embodiment. The substrate processing apparatus performs a plasma etching process on a wafer W as a substrate for a semiconductor device (hereinafter, simply referred to as a wafer W).

Referring to FIG. 1, a substrate processing apparatus 10 includes a chamber 11 accommodating, for example, a wafer W having a diameter of 300 mm. Inside the chamber 11, a susceptor 12 having a cylindrical shape, on which the wafer W for a semiconductor device is placed, is arranged. An exhaust plate 15, which divides an inside of the chamber 11 into a process chamber 13 of an upper section in the drawing and an exhaust chamber 14 of a lower section in the drawing, is arranged between the susceptor 12 and an inner wall of the chamber 11.

Plasma is generated, as will be described later, in the process chamber 13. Also, an exhaust pipe 16, which evacuates a gas inside the chamber 11 through the exhaust chamber 14, is connected to the exhaust chamber 14. Here, the exhaust plate 15 is an annular member having a plurality of through holes (first ventilation holes), and the exhaust plate 15 prevents plasma generated in the process chamber 13 from leaking into the exhaust chamber 14 by catching or reflecting the plasma. Also, the exhaust plate 15 is arranged parallel to the wafer W placed on the susceptor 12, and is arranged at a location lower than a top surface of the wafer W in the drawing.

A turbo molecular pump (hereinafter, referred to as a TMP) and a dry pump (hereinafter, referred to as a DP) (both not shown) are connected to the exhaust pipe 16, and these pumps depressurize the inside of the chamber 11 by vacuum-absorbing the inside of the chamber 11. Also, an APC valve 17 is arranged at the exhaust pipe 16, upstream from the TMP or the DP. The APC valve 17 includes a slide valve 18, and a pressure inside the process chamber 13 is adjusted through the exhaust chamber 14 by adjusting an opening degree of the slide valve 18.

A first high frequency power source 19 is connected to the susceptor 12 inside the chamber 11 through a first matcher 20, and a second high frequency power source 21 is connected to the susceptor 12 through a second matcher 22. The first high frequency power source 19 applies a high frequency power of a relatively high frequency, for example, 40 MHz, to the susceptor 12 to generate plasma, and the second high frequency power source 21 applies a high frequency power of a relatively low frequency, for example, 2 MHz, to the susceptor 12 to drag ions. Accordingly, the susceptor 12 operates as an electrode. Also, the first matcher 20 and the second matcher 22 reduce reflection of high frequency power from the susceptor 12, thereby maximizing application efficiency of high frequency power to the susceptor 12.

An upper portion of the susceptor 12 has a shape where a cylinder having a small diameter protrudes along a concentric axis from a leading end of a cylinder having a large diameter, and a step is provided to surround the cylinder having the small diameter in the upper portion. An electrostatic chuck 24 having an electrostatic electrode plate 23 therein and formed of ceramic is arranged at a leading end of the cylinder having the small diameter. The electrostatic electrode plate 23 is connected to a direct current power source 25, and thus when direct current power of positive potential is applied to the electrostatic electrode plate 23, negative potential is generated on a surface of the wafer W facing the electrostatic chuck 24 (hereinafter, referred to as a back surface). Accordingly, a potential difference is generated between the electrostatic electrode plate 23 and the back surface of the wafer W, and thus the wafer W is adsorbed and held by the electrostatic chuck according to Coulomb force or Johnson-Rahbek force resulting from the potential difference.

Also, a focus ring 26 is placed on the step of the upper portion of the susceptor 12 so as to surround the wafer W adsorbed and held by the electrostatic chuck 24. The focus ring 26 is formed of Si. In other words, since the focus ring 26 is formed of a semi-electrical conductor, a distribution range of plasma is expanded not only over the wafer W, but also over the focus ring 26 so that density of plasma over a peripheral portion of the wafer W is maintained to be the same as density of plasma over a center portion of the wafer W. Accordingly, uniformity of a plasma etching process performed on an entire surface of the wafer W is secured.

A shower head 27 is arranged at a ceiling portion of the chamber 11 to face the susceptor 12. The shower head 27, for example, introduces a mixture gas of various gases having flow rates that are suitably adjusted into the process chamber 13.

In the substrate processing apparatus 10, a process gas introduced into the process chamber 13 turns into plasma by being excited by high frequency power for generating plasma, which is applied from the first high frequency power source 19 into the process chamber 13 through the susceptor 12. Positive ions in the plasma are dragged toward the wafer W by high frequency power for dragging ions, which is applied to the susceptor 12 by the second high frequency power source 21, and perform a plasma etching process on the wafer W.

Also, the substrate processing apparatus 10 includes an exhaust adjustment plate 28 arranged in the exhaust chamber 14, as a mechanism for adjusting a degree of easiness of exhaustion (exhaust conductance) from the process chamber 13. The exhaust adjustment plate 28 is an annular member having a plurality of through holes (second ventilation holes), which are the same shapes as the through holes in the exhaust plate 15. Cross-sectional shapes, a number, and arranged locations of the through holes in the exhaust adjustment plate 28 are identical to cross-sectional shapes, a number, and arranged locations of the through holes in the exhaust plate 15, and the exhaust adjustment plate 28 is arranged on the same axis as the exhaust plate 15. The exhaust adjustment plate 28 is supported by a plurality of rods 29 protruding upward from a bottom part of the chamber 11, and moves in up and down directions in the drawing inside the exhaust chamber 14.

Figure 2A:
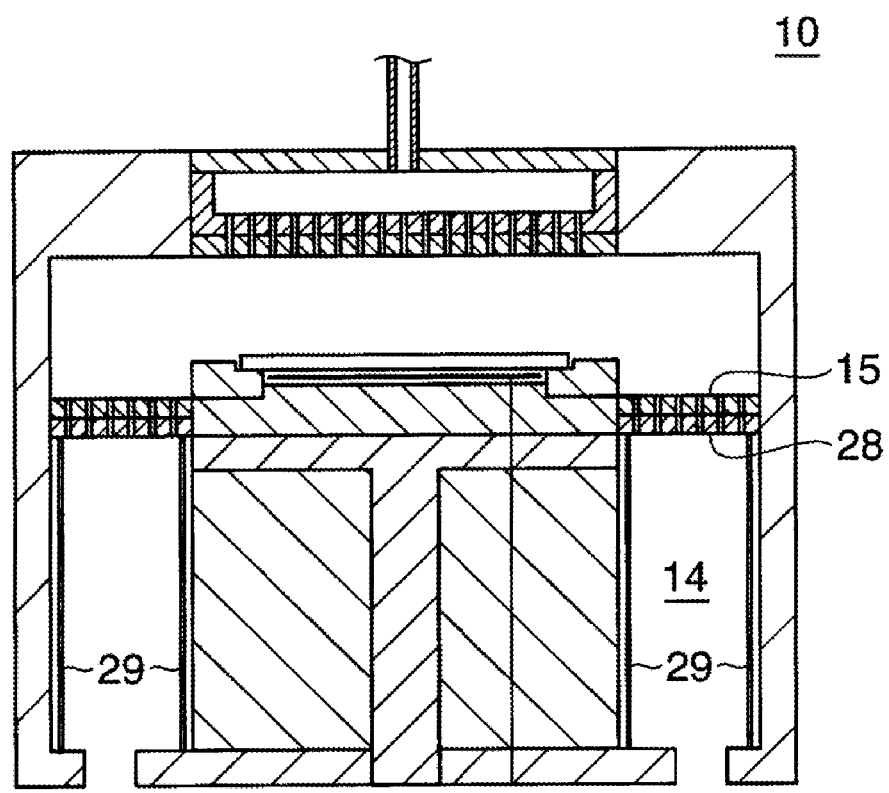
FIGS. 2A and 2B are views for explaining each of exhaust conductance modes in the substrate processing apparatus of FIG. 1, where

In the substrate processing apparatus 10, the exhaust adjustment plate 28 is moved upward as much as possible in the exhaust chamber 14 to contact the exhaust plate 15 in parallel as shown in FIG. 2A, in a medium exhaust conductance mode where resistance of exhaust from the process chamber 13 is about medium. As described above, since the cross-sectional shapes, the numbers, and the arranged locations of the through holes in the exhaust plate 15 and the exhaust adjustment plate 28 are the same, the exhaust plate 15 and the exhaust adjustment plate 28 may be considered as the exhaust plate 15 having a doubled thickness.

In the present embodiment, thicknesses of the exhaust plate 15 and the exhaust adjustment plate 28 are each 3 mm, the through holes in the exhaust plate 15 and the exhaust adjustment plate 28 have cylindrical shapes and each has a diameter of 3 mm, and the number of through holes in the exhaust plate 15 and the exhaust adjustment plate 28, respectively, is 5800. Conductance ($C_1$) of an orifice may be represented by 116× cross-sectional area (refer to Equation (1.7.6) of page 41, Ohmusa, Ulvac Corporation Compilation, "New Edition of Vacuum Handbook"), and here, $C_1 = 8.2 \times 10^{-4}$ (m³/s).

Also, when a hole has a cylindrical shape, the conductance ($C_1$) of the orifice needs to be multiplied by a calibrating constant ($K_2$), and when a length/diameter is 2 (=6 mm/3 mm), the calibrating constant ($K_2$) is 0.359 (refer to Equation (7 of 1.7.2) in Table of page 43, Ohmusa, Ulvac Corporation Compilation, "New Edition of Vacuum Handbook"). Accordingly, conductance ($C_M$) in the medium exhaust conductance mode of the present embodiment is represented by Equation 1 below, and is 1.7 (m³/s).

$$C_M = K_2 \times C_1 \times 5800 = 0.359 \times 8.2 \times 10^{-4} \times 5800 \qquad (1)$$

Figure 2B:
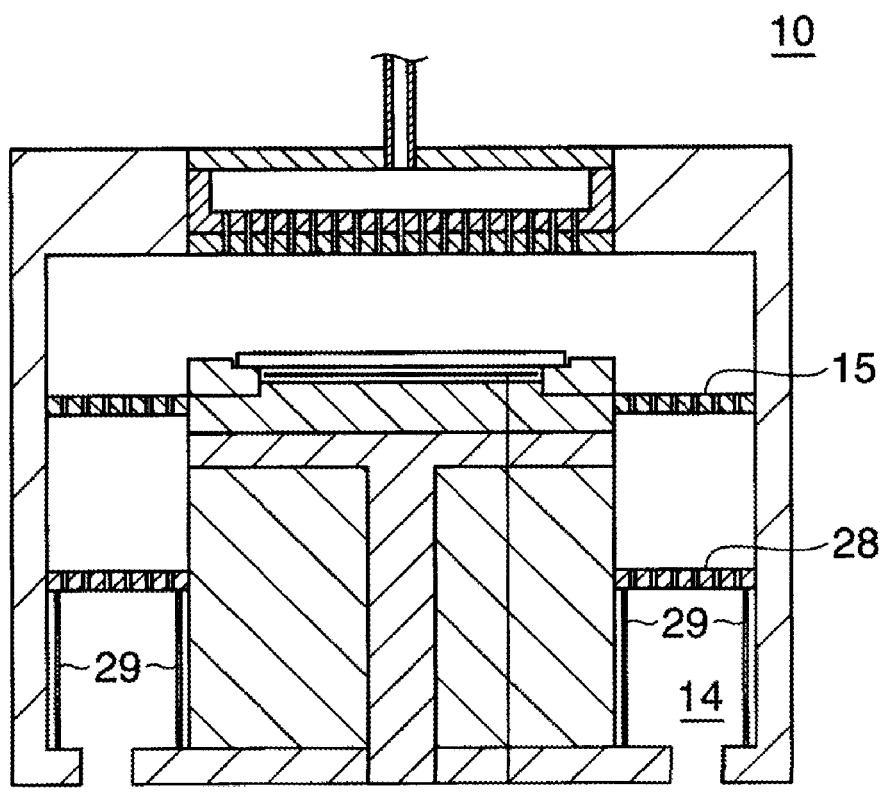

Also, the exhaust adjustment plate 28 is moved downward in the exhaust chamber 14 to separate the exhaust adjustment plate 28 from the exhaust plate 15 as shown in FIG. 2B, in a low exhaust conductance mode where resistance of exhaust from the process chamber 13 is high. Here, the exhaust adjustment plate 28 and the exhaust plate 15 may be considered as individual resistors arranged in series to a direction of exhaust.

A calibrating constant ($K_2$) in the exhaust adjustment plate 28 or the exhaust plate 15 is 0.514 since length/diameter is 1 (=3 mm/3 mm) (refer to Equation (7 of 1.7.2) in Table of page 43, Ohmusa, Ulvac Corporation Compilation, "New Edition of Vacuum Handbook"). Accordingly, conductance (C) of the exhaust adjustment plate 28 or the exhaust plate 15 is represented by Equation 2 below, and is 2.4 (m³/s).

$$C = K_2 \times C_1 \times 5800 = 0.514 \times 8.2 \times 10^{-4} \times 5800 \qquad (2)$$

Also, as described above, since the exhaust plate 15 and the exhaust adjustment plate 28 are considered as resistors arranged in series, conductance ($C_L$) in the low exhaust conductance mode of the present embodiment is represented by Equation 3 below, and is 1.2 (m³/s).

$$1/C_L = 1/C + 1/C = 1/2.4 + 1/2.4 \qquad (3)$$

While the exhaust adjustment plate 28 is separated from the exhaust plate 15 in the low exhaust conductance mode, if the exhaust adjustment plate 28 is close to the exhaust plate 15, the exhaust adjustment plate 28 may not definitely operate as a resistor since the exhaust adjustment plate 28 is affected by an end effect of conductance of the exhaust plate 15. A distance affected by an end effect of conductance may be represented by L+4×D/3, where L denotes the thickness of the exhaust plate 15 and D denotes the diameter of one through hole in the exhaust plate 15, and thus the exhaust adjustment plate 28 may be separated from the exhaust plate 15 by at least 4×D/3 so that the exhaust adjustment plate 28 is not affected by the end effect of the conductance of the exhaust plate 15. Here, since D is 3 mm, the exhaust adjustment plate 28 may be separated from the exhaust plate 15 by 4 mm or more in the low exhaust conductance mode.

Here, if the exhaust adjustment plate 28 is affected by the end effect of the conductance of the exhaust plate 15, the conductance ($C_L$) changes non-linearly instead of linearly, and thus the conductance ($C_L$) may remarkably change. In order to use the remarkable change of the conductance ($C_L$), the distance affected by the end effect of conductance may be somewhat large, and for example, the term of 4×D/3 in the above equation L+4×D/3 may be equal to or above a value about equal to L (the distance affected by the end effect of conductance is about the thickness of the exhaust plate 15). Here, a relationship between the thickness L of the exhaust plate 15 and the diameter D of one through hole in the exhaust plate 15 may be L/D<1.33 based on Equation 4 below.

$$L < 4 \times D/3 \qquad (4)$$

According to the substrate processing apparatus 10 of the present embodiment, since the movable exhaust adjustment plate 28 is arranged inside the exhaust chamber 14, which is separated from the process chamber 13 by the exhaust plate 15, particles stay inside the exhaust chamber 14 even if adhered product or the like is peeled off as the exhaust adjustment plate 28 moves, and thus the particles may be prevented from appearing inside the process chamber 13. Also, since the exhaust adjustment plate 28 is not arranged in the process chamber 13, distribution of plasma in the process chamber 13 may be prevented from being scattered. Also, since the exhaust adjustment plate 28 is capable of contacting the exhaust plate 15 in parallel, the exhaust adjustment plate 28 and the exhaust plate 15 may substantially integrate as a resistor. Meanwhile, since the exhaust adjustment plate 28 is capable of being separated from the exhaust plate 15, the exhaust adjustment plate 28 and the exhaust plate 15 may operate as individual resistors. As a result, an adjustment range of exhaust conductance may be increased.

Also, according to the substrate processing apparatus 10 of the present embodiment, the exhaust adjustment plate 28 contacts the exhaust plate 15 in the medium exhaust conductance mode, and thus the exhaust adjustment plate 28 and the exhaust plate 15 may substantially integrate as a resistor, thereby realizing about medium exhaust resistance by using only one resistor having relatively large resistance. Also, since the exhaust adjustment plate 28 is separated from the exhaust plate 15 in the low exhaust conductance mode, the exhaust adjustment plate 28 and the exhaust plate 15 may operate as individual resistors, thereby realizing high exhaust resistance by arranging two resistors in series.

In the substrate processing apparatus 10 described above, since the exhaust adjustment plate 28 is separated from the exhaust plate 15 by 4 mm or more in the low exhaust conductance mode, the exhaust adjustment plate 28 is not affected by an end effect of exhaust conductance of the exhaust plate 15, and thus the exhaust adjustment plate 28 and the exhaust plate 15 may definitely operate as individual resistors.

In the substrate processing apparatus 10 described above, the cross-sectional shapes of the through holes in the exhaust plate 15 or the exhaust adjustment plate 28 are circles, but the cross-sectional shapes of the through holes are not limited thereto, and may be, for example, rectangles or slit shapes. Also, sizes of the through holes in the exhaust plate 15 and the exhaust adjustment plate 28 may not be the same.

In addition, since the exhaust adjustment plate 28 is arranged in the exhaust chamber 14 instead of the process chamber 13, the exhaust adjustment plate 28 does not contact plasma, and is rarely consumed. Accordingly, the exhaust adjustment plate 28 is rarely required to be replaced.

Next, a substrate processing apparatus according to a second embodiment of the present invention will be described.

Since a structure and operations of the present embodiment is basically identical to those of the first embodiment described above, overlapping structures and operations will not be described, and different structures and operations will be described hereinafter.

Figure 3:
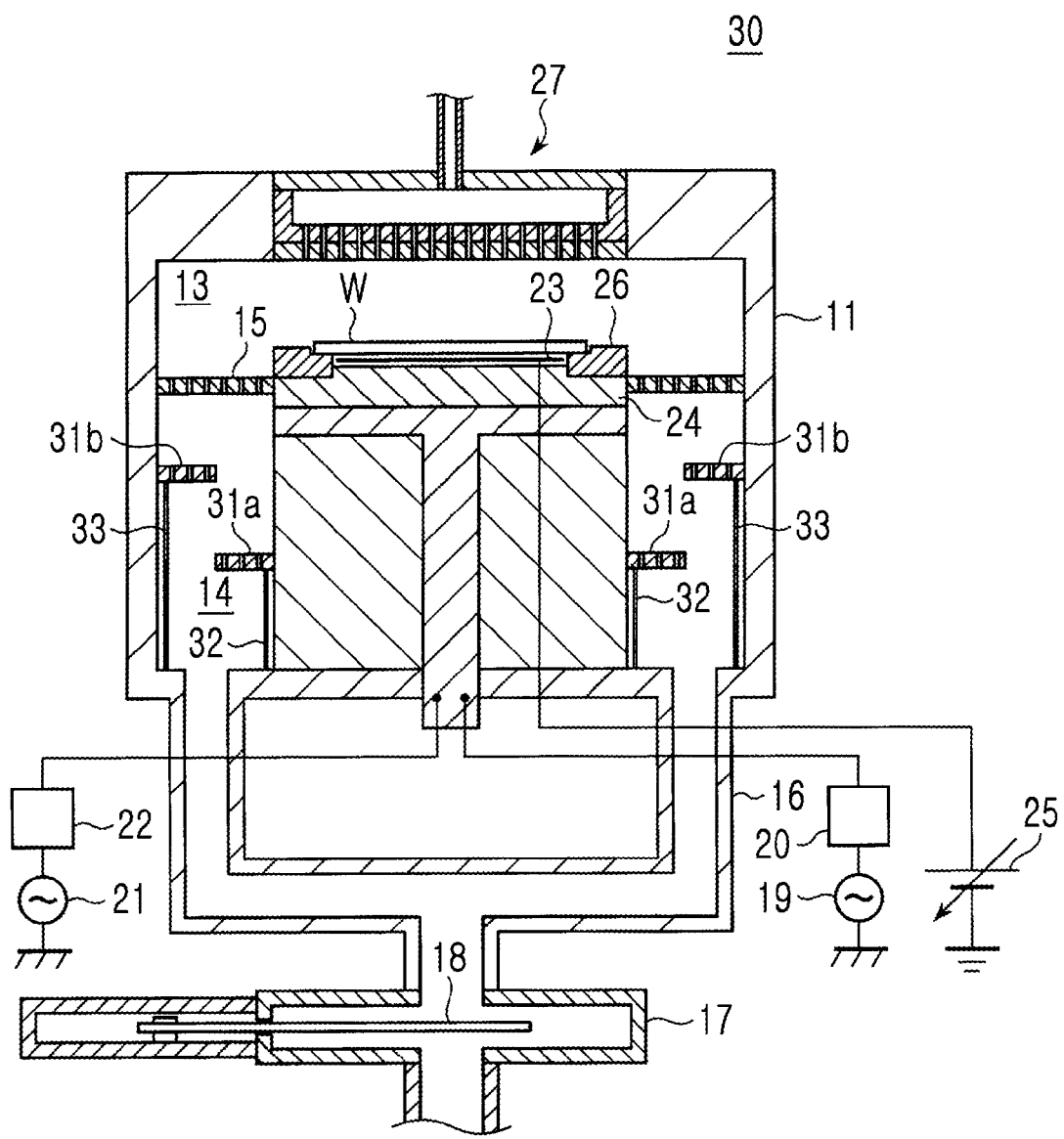
FIG. 3 is a view schematically showing a structure of a substrate processing apparatus according to a second embodiment of the present invention.

FIG. 3 is a view schematically showing a structure of a substrate processing apparatus according to the present embodiment.

Referring to FIG. 3, a substrate processing apparatus 30 includes an exhaust adjustment plate 31 that is capable of being divided into two sections 31a and 31b, instead of the exhaust adjustment plate 28, in the exhaust chamber 14.

The exhaust adjustment plate 31 is an annular member having a plurality of through holes, which is the same shape as the through holes in the exhaust plate 15. Cross-sectional shapes, a number, and arranged locations of the through holes in the exhaust adjustment plate 31 are identical to the cross-sectional shapes, the number, and the arranged locations of the through holes in the exhaust plate 15, and the exhaust adjustment plate 31 is arranged on the same axis as the exhaust plate 15.

Figure 4A:
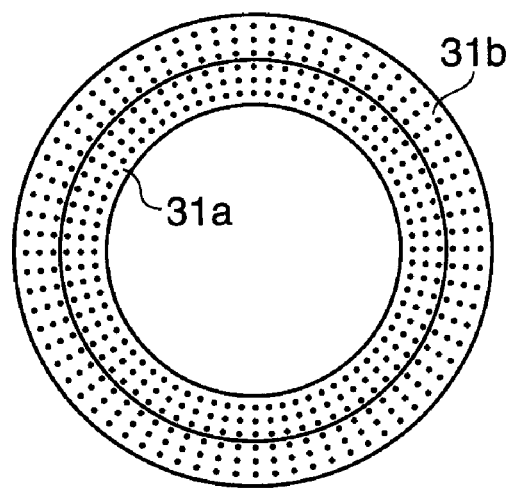
FIGS. 4A through 4E are views showing an exhaust adjustment plate used in the substrate processing apparatus of FIG. 3, where

As shown in FIG. 4A, the exhaust adjustment plate 31 is divided into an inner circumference section 31a and an outer circumference section 31b when viewed from a plane. Referring back to FIG. 3, the inner circumference section 31a is supported by a plurality of rods 32 protruding upward from the bottom part of the chamber 11, and moves in the exhaust chamber 14 in up and down directions in the drawing. Also, the outer circumference section 31b is supported by a plurality of rods 33 protruding upward from the bottom part of the chamber 11, and moves in the exhaust chamber 14 in the up and down directions in the drawing.

Figure 5A:
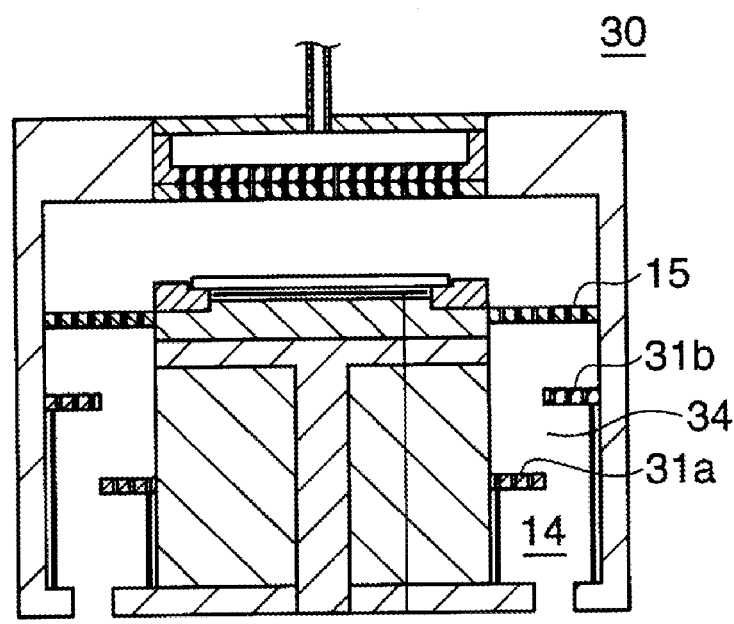
FIGS. 5A through 5C are views for explaining each of exhaust conductance modes in the substrate processing apparatus of FIG. 3, where

In the substrate processing apparatus 30, in a high exhaust conductance mode where resistance of exhaust from the process chamber 13 is low, the exhaust adjustment plate 31 is separated from the exhaust plate 15 while being divided into the inner circumference section 31a and the outer circumference section 31b, and the inner circumference section 31a and the outer circumference section 31b are arranged in different locations, respectively, to a flow direction of exhaust in the exhaust chamber 14, in detail, in different locations, respectively, in the up and down directions in the drawing, as shown in FIG. 5A. Here, since the exhaust adjustment plate 31 has a relatively large opening 34 between the inner circumference section 31a and the outer circumference section 31b, the exhaust adjustment plate 31 does not operate as a resistor to exhaust.

Accordingly, conductance ($C_H$) in the high exhaust conductance mode is identical to the conductance (C) of the exhaust plate 15, and is 2.4 (m$^3$/s) as represented by Equation 5 below.

$$C_{H=C=}2.4 \qquad (5)$$

Also, since a size of the opening 34 needs to be equal to or above a certain value in the high exhaust conductance mode, the inner circumference section 31a and the outer circumference section 31b may be separated from each other by at least 4 mm or more in the up and down directions in the drawing.

Figure 5B:
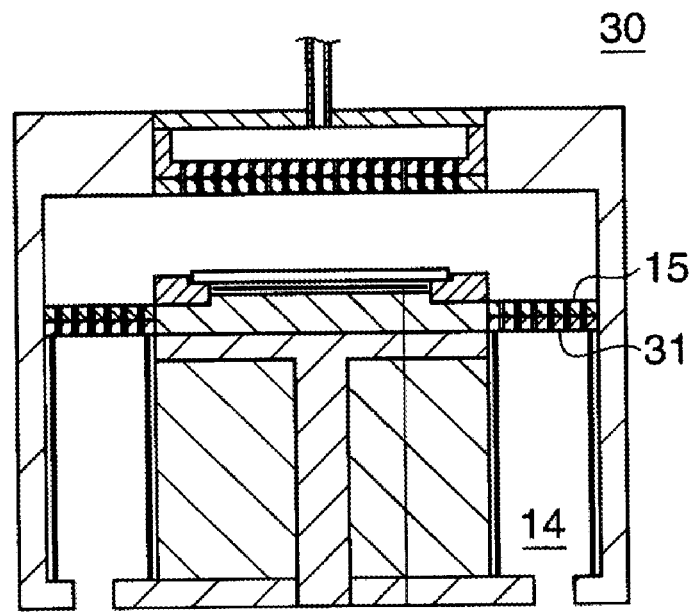
Figure 5C:
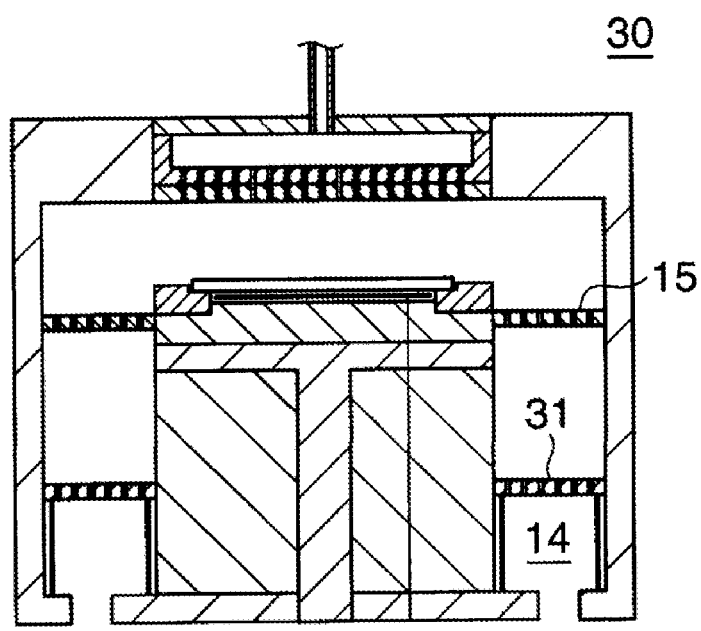

Also, in the medium exhaust conductance mode of the substrate processing apparatus 30, the exhaust adjustment plate 31 contacts the exhaust plate 15 in parallel by moving the exhaust adjustment plate 31 upward as much as possible in the exhaust chamber 14 without dividing the exhaust adjustment plate 31 as shown in FIG. 5B. Here, conductance ($C_M$) is 1.7 (m$^3$/s) like in the first embodiment. Also, in the low exhaust conductance mode, the exhaust adjustment plate 31 is separated from the exhaust plate 15 by moving the exhaust adjustment plate 31 downward in the exhaust chamber 14 without dividing the exhaust adjustment plate 31, as shown in FIG. 5C. Here, conductance ($C_L$) is 1.2 (m$^3$/s) like in the first embodiment.

According to the substrate processing apparatus 30 of the present embodiment, since the inner circumference section 31a and the outer circumference section 31b are arranged in different locations, respectively, in the flow direction of exhaust when the exhaust adjustment plate 31 is divided, the exhaust adjustment plate 31 may definitely not operate as a resistor, and thus the adjustment range of the exhaust conductance may be further increased.

Figure 4B:
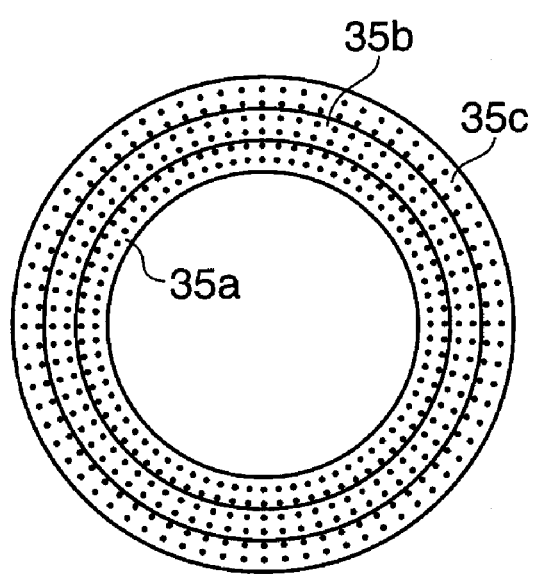
Figure 4C:
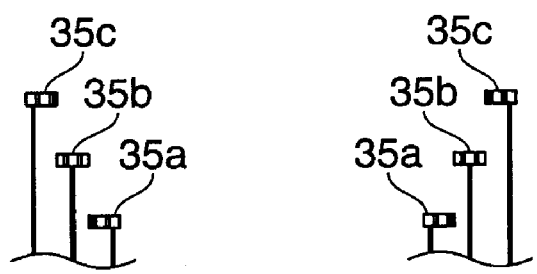
Figure 4D:
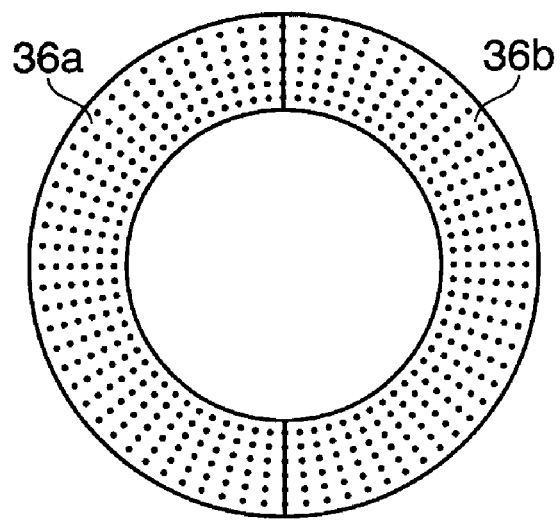
Figure 4E:
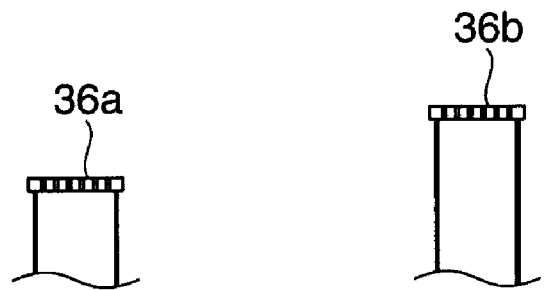

In the present embodiment, the exhaust adjustment plate 31 is divided into the inner circumference section 31a and the outer circumference section 31b, but a dividing method is not limited thereto as long as an exhaust adjustment plate does not operate as a resistor. For example, an exhaust adjustment plate may be divided into an inner circumference section 35a, a medium section 35b, and an outer circumference section 35c when viewed from a plane as shown in FIG. 4B, and at this time, the inner circumference section 35a, the medium section 35b, and the outer circumference section 35c may be arranged in different locations, respectively, in a flow direction of exhaust in a high exhaust conductance mode, as shown in FIG. 4C. Alternatively, for example, an exhaust adjustment plate may be divided into a left section 36a and a right section 36b when viewed from a plane as shown in FIG. 4D, and at this time, the left section 36a and the right section 36b are arranged in different locations, respectively, in a flow direction of exhaust in a high exhaust conductance mode, as shown in FIG. 4E.

Figure 6:
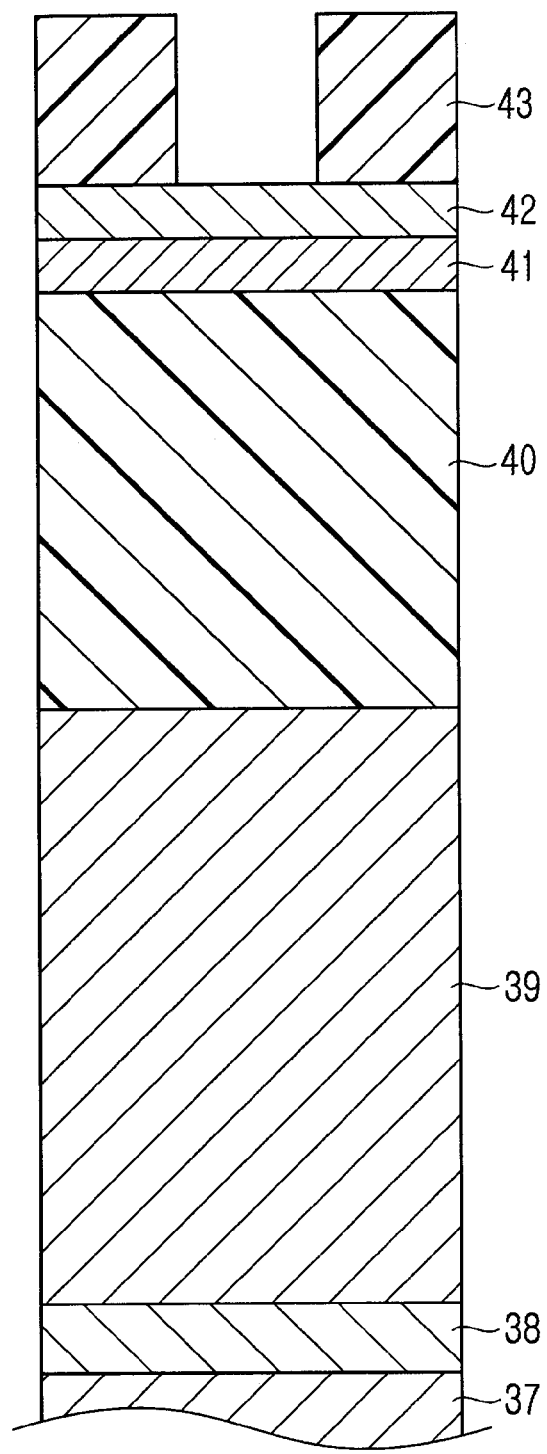
FIG. 6 is a partial cross-sectional view showing a film configuration of a wafer on which a plasma etching process is performed by the substrate processing apparatus of FIG. 3.

FIG. 6 is a partial cross-sectional view showing a film configuration of the wafer W on which a plasma etching process is performed by the substrate processing apparatus 30 of FIG. 3.

Referring to FIG. 6, the wafer W includes a silicon nitride (SiN) film 38, a silicon oxide ($SiO_2$) film (insulating film) 39, an amorphous carbon film 40, a silicon oxynitride (SiON) film 41 (hard mask), a reflection preventing film 42, and a photoresist film 43, sequentially deposited from the bottom in the drawing, on a silicon base portion 37.

In the low exhaust conductance mode of the substrate processing apparatus 30, since a process gas stays in the process chamber 13 for relatively long time (a long residence time), a relative amount of radicals in plasma increases as the process gas is dissociated. Accordingly, the low exhaust conductance mode is suitable for isotropic etching or chemical reactive etching which is mainly done by radicals. Alternatively, in the high exhaust conductance mode, since the process gas stays in the process chamber 13 for short time (a short residence time), the process gas is not dissociated much, and a relative amount of radicals in plasma is decreased. Accordingly, the high exhaust conductance mode is suitable for anisotropic etching or physical etching which is mainly done by sputtering by positive ions.

The substrate processing apparatus 30 is in the medium exhaust conductance mode while etching the reflection preventing film 42 and the silicon oxynitride film 41 by plasma by using the photoresist film 43 as a mask in the wafer W of FIG. 6, for a good balance of chemical reactive etching and physical etching of the reflection preventing film 42 and the silicon oxynitride film 41.

Then, with respect to the amorphous carbon film 40, the present inventors provided a trench on an amorphous carbon film via etching using plasma by changing a flow rate of an oxygen gas as a process gas, before the present invention. In detail, it was discovered that a shape of a trench was improved as a bowing (a swollen portion in a horizontal direction) of the trench was decreased from 118 nm to 100 nm, and a critical dimension (width) of a bottom part of the trench was also decreased from 133 nm to 100 nm when the flow rate of oxygen gas was increased from 130 sccm to 900 sccm under predetermined conditions (pressure inside the process chamber 13: 20 mTorr, high frequency power for generating plasma: 800 W, and high frequency power for dragging ions: 0 W). It was considered that the shape of the trench was improved because a residence time of the oxygen gas in the process chamber 13 was reduced by increasing the flow rate of oxygen gas, and isotropic etching was suppressed by suppressing generation of oxygen radicals.

Accordingly, the substrate processing apparatus 30 may be in the high exhaust conductance mode while etching the amorphous carbon film 40 by plasma, so as to improve a shape of a hole or trench that is provided.

Then, with respect to the silicon oxide film 39, the present inventor provided a trench via etching by plasma on a silicon oxide film by changing a flow rate of a mixture gas (a mixture gas of $C_5F_8$ gas, argon gas, and oxygen gas) as a process gas, before the present invention.

In detail, it was discovered that an etching rate of the silicon oxide film was increased from 5401 Å/min to 5993 Å/min with nearly no change of etching selectivity (about 5) of the silicon oxide film to the photoresist film, when the flow rate of the mixture gas was increased from 414 sccm to 785 sccm and a flow rate of $C_5F_8$ gas was increased from 15 sccm to 29 sccm, under predetermined conditions (pressure inside the process chamber 13: 15 mTorr, high frequency power for generating plasma: 2170 W, and high frequency power for dragging ions: 1550 W).

Alternatively, it was discovered that an etching rate of the silicon oxide film was increased from 513 nm/min to 587 nm/min with nearly no change of the etching selectivity (about 5) of the silicon oxide film to the photoresist film, when the flow rate of the mixture gas was increased from 431 sccm to 754.3 sccm and the flow rate of the $C_5F_8$ gas was increased from 15 sccm to 26.3 sccm, under another predetermined conditions (pressure inside the process chamber 13: 20 mTorr, high frequency power for generating plasma: 1800 W, high frequency power for dragging ions: 1500 W).

It was considered that the etching rate of the silicon oxide film was improved because sputtering using positive ions was improved as positive ions of the $C_5F_8$ gas was increased by increasing the flow rate of the $C_5F_8$ gas.

Accordingly, in order to increase the etching rate when the silicon oxide film 39 is etched by using plasma in the substrate processing apparatus 30, the substrate processing apparatus 30 may facilitate the flow of the mixture gas at a high flow rate in the process chamber 13. In other words, the substrate processing apparatus 30 may be in the high exhaust conductance mode.

Next, with respect to washing inside the process chamber 13 by plasma after transferring the wafer W, where the silicon oxide film 39 is etched, from the chamber 11 (hereinafter, referred to as waferless dry cleaning), the present inventors ashed a predetermined organic film via etching by plasma by changing a flow rate of an oxygen gas as a process gas, before the present invention. In detail, it was discovered that an ashing rate was gradually decreased as the flow rate of the oxygen gas was increased from 475 sccm to 800 sccm under predetermined conditions (pressure inside the process chamber 13: 400 mTorr, high frequency power for generating plasma: 800 W, high frequency power for dragging ions: 0 W). It was considered that the ashing rate was decreased because generation of oxygen radicals was suppressed and chemical reactive etching of the organic film by the oxygen radicals was suppressed as a residence time of the oxygen gas in the process chamber 13 was reduced by increasing the flow rate of the oxygen gas.

Accordingly, the substrate processing apparatus 30 may be in the low exhaust conductance mode while performing the waferless dry cleaning so as to prevent deterioration of ashing rate, i.e., to prevent deterioration of washing efficiency.

Next, a substrate processing apparatus according to a third embodiment of the present invention will be described.

Since a structure and operations of the present embodiment is basically identical to those of the first embodiment described above, overlapping structures and operations will not be described, and different structures and operations will be described hereinafter.

Figure 7:
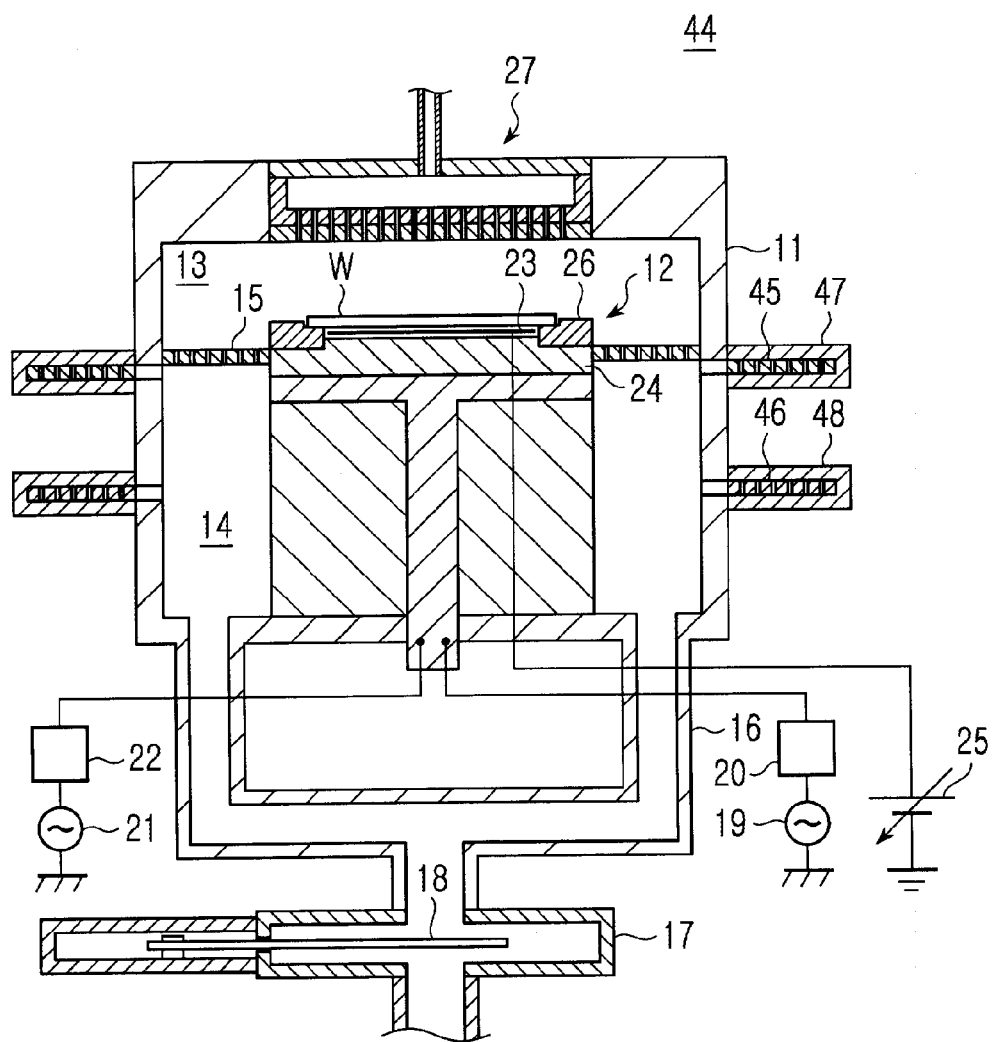
FIG. 7 is a view schematically showing a structure of a substrate processing apparatus according to a third embodiment of the present invention.

FIG. 7 is a view schematically showing a structure of a substrate processing apparatus according to the present embodiment.

Referring to FIG. 7, a substrate processing apparatus 44 includes two exhaust adjustment plates 45 and 46 that freely move in and out of the exhaust chamber 14, instead of the exhaust adjustment plate 28.

The exhaust adjustment plate 45 includes a plurality of division members which constitute one platy and annular member when entered the exhaust chamber 14, for example, includes a plurality of members obtained by dividing a platy and an annular member to a circumference direction when viewed from a plane. When the exhaust adjustment plate 45 is one platy and annular member by entering the exhaust chamber 14, cross-sectional shapes, a number, arranged locations of through holes in the exhaust adjustment plate 45 are identical to the cross-sectional shapes, the number, and the arranged locations of the through holes in the exhaust plate 15, and the exhaust adjustment plate 45 contacts the exhaust plate 15 in parallel. Also, when the exhaust adjustment plate 45 is divided into the plurality of division members, each division member is moved out from the exhaust chamber 14 and accommodated in an exhaust adjustment plate accommodating chamber 47 provided at an outer wall of the chamber 11.

The exhaust adjustment plate 46 has the same structure as the exhaust adjustment plate 45, and is arranged in parallel to the exhaust plate 15 when the exhaust adjustment plate 46 is one platy and annular member by entering the exhaust chamber 14. Also, when the exhaust adjustment plate 46 is divided into a plurality of division members, each division member is moved out from the exhaust chamber 14 and accommodated in an exhaust adjustment plate accommodating chamber 48 provided at an outer wall of the chamber 11.

The exhaust adjustment plate 45 and the exhaust adjustment plate 46 are arranged to be spaced apart from each other by 4 mm or more in a direction of exhaust in the exhaust chamber 14. Accordingly, the exhaust adjustment plate 46 may be prevented from being affected by an end effect of conductance of the exhaust adjustment plate 45.

Figure 8A:
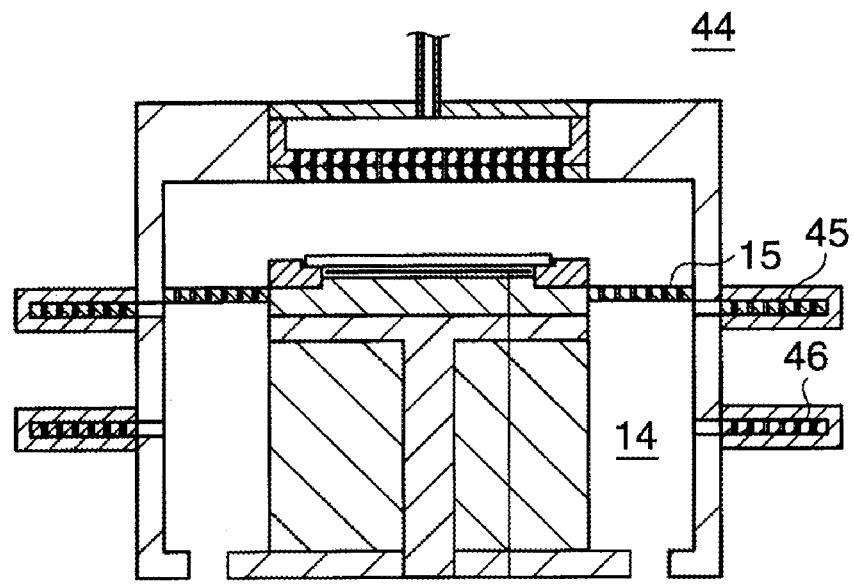
FIGS. 8A through 8C are views for explaining each of exhaust conductance modes in the substrate processing apparatus of FIG. 7, where

In a high exhaust conductance mode of the substrate processing apparatus 44, the exhaust adjustment plate 45 and the exhaust adjustment plate 46 are moved out from the exhaust chamber 14 as shown in FIG. 8A. Accordingly, only the exhaust plate 15 operates as a resistor to exhaust, and conductance ($C_H$) is 2.4 (m$^3$/s) like in the second embodiment.

Figure 8B:
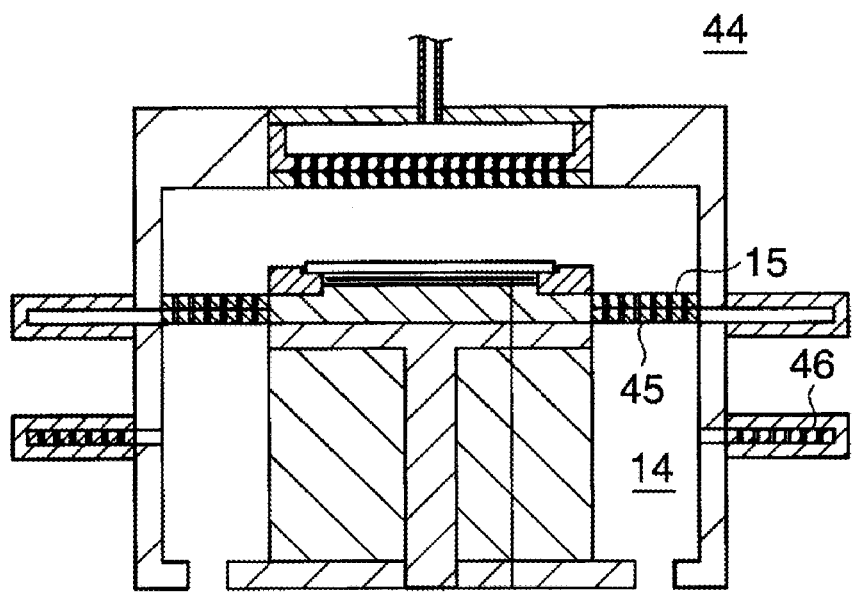

Also, in a medium exhaust conductance mode, the exhaust adjustment plate 46 is moved out from the exhaust member 14 but the exhaust adjustment plate 45 enters the exhaust chamber 14 to contact the exhaust plate 15 in parallel as shown in FIG. 8B. Here, the exhaust plate 15 and the exhaust adjustment plate 45 may be considered as the exhaust plate 15 having a doubled thickness, and conductance ($C_M$) is 1.7 (m$^3$/s) like in the first embodiment.

Figure 8C:
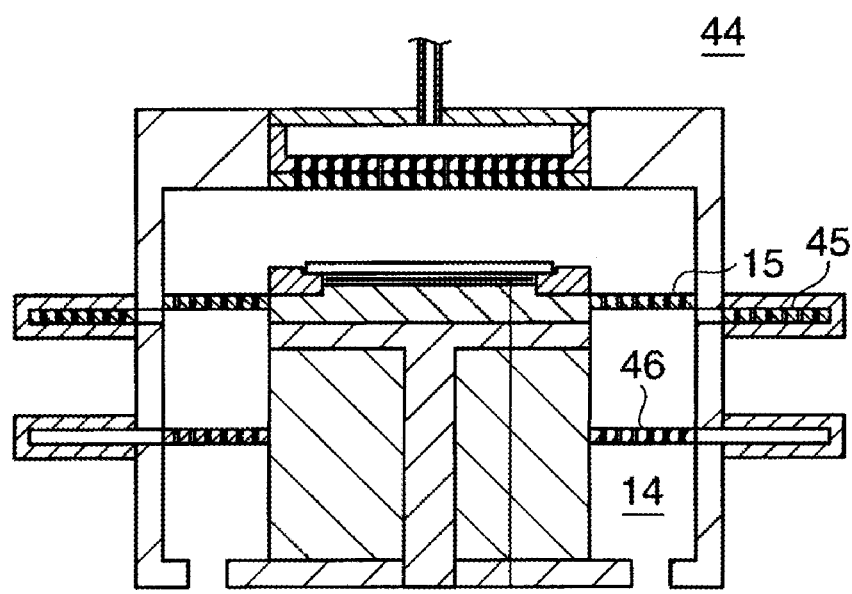

Also, in a low exhaust conductance mode, the exhaust adjustment plate 45 is moved out from the exhaust chamber 14 but the exhaust adjustment plate 46 enters the exhaust chamber 14 to be arranged in parallel to the exhaust plate 15 as shown in FIG. 8C. Here, the exhaust adjustment plate 46 and the exhaust plate 15 may be considered as individual resistors arranged in series in the direction of exhaust, and conductance ($C_L$) is 1.2 (m$^3$/s) like in the first embodiment.

Also, a substrate on which a plasma etching process is performed by the substrate processing apparatus according to each embodiment described above is not limited to a wafer for a semiconductor device, and may be any substrate used in a flat panel display (hereinafter, referred to as an FPD) or the like including a liquid crystal display (LCD) or the like, a photo mask, a CD substrate, a print substrate, or the like.

According to the present invention, since a movable exhaust adjustment plate is arranged inside an exhaust chamber separated from a process chamber by an exhaust plate, particles stay inside the exhaust chamber even if adhered product or the like is peeled off as the exhaust adjustment plate moves, and thus the particles may be prevented from appearing inside the process chamber. Also, since the exhaust adjustment plate is not arranged inside the process chamber, distribution of plasma inside the process chamber may be prevented from being scattered. Also, since the exhaust adjustment plate is capable of contacting the exhaust plate in parallel, the exhaust adjustment plate and the exhaust plate may substantially integrate as a resistor. Meanwhile, since the exhaust adjustment plate is capable of being separated from the exhaust plate, the exhaust adjustment plate and the exhaust plate may operate as individual resistors. As a result, an adjustment range of exhaust conductance may be increased.

Also, according to the present invention, in a medium exhaust conductance mode, the exhaust adjustment plate contacts the exhaust plate, and thus the exhaust adjustment plate and the exhaust plate may substantially integrate as a resistor, thereby realizing about medium exhaust resistance by using only one resistor having relatively large resistance. Also, in a low exhaust conductance mode, since the exhaust adjustment plate is separated from the exhaust plate, the exhaust adjustment plate and the exhaust plate may operate as individual resistors, thereby realizing high exhaust resistance by arranging two resistors in series.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A substrate processing apparatus comprising:
   a process chamber accommodating a substrate to perform a plasma process on the substrate;
   an exhaust chamber communicating with the process chamber;
   an exhaust plate dividing the process chamber from the exhaust chamber, including a plurality of first ventilation holes penetrating through the exhaust plate, and preventing plasma in the process chamber from leaking into the exhaust chamber; and
   an exhaust adjustment plate arranged inside the exhaust chamber, moving towards and away from the exhaust plate, and including a plurality of second ventilation holes penetrating through the exhaust adjustment plate,
   wherein
   the exhaust adjustment plate comprises a first exhaust adjustment plate and a second exhaust adjustment plate, and the first exhaust adjustment plate and the second exhaust adjustment plate independently move toward and away from the exhaust plate.

2. The substrate processing apparatus of claim 1, wherein the exhaust adjustment plate has an annular shape when viewed from a plane.

3. The substrate processing apparatus of claim 1, wherein the exhaust adjustment plate is spaced apart from the exhaust plate by 4 mm or more.

4. The substrate processing apparatus of claim 1, wherein the first ventilation holes have a cylindrical shape, and when L denotes a length of the first ventilation holes and D denotes a diameter of the first ventilation holes, a relationship between L and D is L/D<1.33.

5. The substrate processing apparatus of claim 1, wherein a cross-sectional shape of the first ventilation holes is a circular, rectangular, or slit shape.

6. The substrate processing apparatus of claim 1, wherein a cross-sectional shape of the second ventilation holes is a circular, rectangular, or slit shape.

7. The substrate processing apparatus of claim 1, wherein the exhaust plate is arranged parallel to the substrate accommodated inside the process chamber, and is arranged at a location lower than a top surface of the substrate.

* * * * *